United States Patent
Lin et al.

(10) Patent No.: US 9,054,149 B2
(45) Date of Patent: Jun. 9, 2015

(54) SEMICONDUCTOR DEVICE WITH DIAGONAL CONDUCTION PATH

(75) Inventors: Xin Lin, Phoenix, AZ (US); Daniel J. Blomberg, Chandler, AZ (US); Jiangkai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 149 days.

(21) Appl. No.: 13/605,214

(22) Filed: Sep. 6, 2012

(65) Prior Publication Data
US 2014/0061858 A1 Mar. 6, 2014

(51) Int. Cl.
*H01L 29/73* (2006.01)
*H01L 29/66* (2006.01)
*H01L 21/225* (2006.01)

(52) U.S. Cl.
CPC ............ *H01L 29/73* (2013.01); *H01L 29/6625* (2013.01); *H01L 21/2253* (2013.01)

(58) Field of Classification Search
CPC ................................................ H01L 2924/1305
USPC ........................... 257/565; 438/353–363, 370
See application file for complete search history.

(56) References Cited

U.S. PATENT DOCUMENTS

| | | | |
|---|---|---|---|
| 4,398,962 A * | 8/1983 | Kanazawa | 438/365 |
| 5,100,810 A | 3/1992 | Yoshimi et al. | |
| 5,104,816 A | 4/1992 | Verret et al. | |
| 5,500,392 A * | 3/1996 | Reynolds et al. | 438/401 |
| 5,698,459 A * | 12/1997 | Grubisich et al. | 438/350 |
| 5,726,069 A * | 3/1998 | Chen et al. | 438/309 |
| 6,693,344 B1 * | 2/2004 | Sato et al. | 257/553 |
| 7,489,007 B2 * | 2/2009 | Williams et al. | 257/335 |
| 2001/0013636 A1 * | 8/2001 | Dunn et al. | 257/565 |
| 2006/0270203 A1 * | 11/2006 | Coolbaugh et al. | 438/527 |
| 2007/0138597 A1 * | 6/2007 | Violette | 257/593 |
| 2012/0098096 A1 * | 4/2012 | Lin et al. | 257/565 |

* cited by examiner

*Primary Examiner* — Mark Tornow
(74) *Attorney, Agent, or Firm* — Lempia Summerfield Katz LLC (57) ABSTRACT

A method of fabricating a bipolar transistor including emitter and base regions having first and second conductivity types, respectively, includes forming an isolation region at a surface of a semiconductor substrate, the isolation region having an edge that defines a boundary of an active area of the emitter region, and implanting dopant of the second conductivity type through a mask opening to form the base region in the semiconductor substrate. The mask opening spans the edge of the isolation region such that an extent to which the dopant passes through the isolation region varies laterally to establish a variable depth contour of the base region.

20 Claims, 4 Drawing Sheets

000
SEMICONDUCTOR DEVICE WITH DIAGONAL CONDUCTION PATH

FIELD OF INVENTION

The present embodiments relate to semiconductor devices.

BACKGROUND

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Power transistor devices are designed to be tolerant of the high currents and voltages that are present in power applications such as motion control, air bag deployment, and automotive fuel injector drivers. One type of power transistor is a laterally diffused metal-oxide-semiconductor (LDMOS) transistor. Power transistor devices may have a number of features customized to prevent breakdown resulting from the high electric fields arising from such high voltages.

Power transistor devices are often combined in ICs with low voltage FET transistor devices. The low voltage devices provide logic or analog functionality to support the operation of the high voltage devices. The fabrication process flow is thus configured with a considerable number of steps directed to creating features specific to the high voltage FET devices and the low voltage FET devices. The steps may be highly customized to optimize the features of the high and low voltage devices.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Bipolar transistor devices having a base region (or an emitter-base junction) with a variable depth contour are described. Methods of fabricating such devices are also described. The variable depth contour may establish or define a diagonal conduction path across a narrowed section of the base region. The narrowed section of the base region (or a portion of an emitter-base junction) may also have a diagonal orientation. Currents through the base region may thus conduct along a diagonal direction transverse to the orientation of the base region section (or the emitter-base junction).

The variable depth contour and the resulting narrowed base region section, and the diagonal orientations of the conduction path and/or the base region section (or the emitter-base junction) may arise from implant ion channeling effects in active and non-active areas. In the non-active areas, the dopant ions being implanted are inhibited by travel through a dielectric structure, such as a field oxide region or shallow trench isolation (STI) region. The dopant ion distribution under the dielectric structure is therefore shallower than the distribution under the active areas. For implants spanning the transition between the active and non-active areas, the dopant profile exhibits a variable depth contour established by an edge of the dielectric structure (e.g., a trench edge). The position of the variable depth contour may thus be aligned with the edge. As described below, the base region of the disclosed devices has a section with a boundary defined in this manner. The boundary may correspond with the emitter-base junction. As a result, the base region need not rely on mask alignment accuracy, being instead self-aligned with the trench or other dielectric edge, e.g., near the emitter active region.

The edge-aligned definition of the base region allows a collector region of the disclosed devices to be defined separately from an implant procedure for the emitter region. The collector region may instead be defined by one or more implants not directed to forming the emitter region. In the examples described below, the collector region is instead defined by the absence of such implants. For example, the collector region may correspond with a portion of a semiconductor substrate (e.g., an epitaxial layer thereof) not doped by one or more implant procedures for the base region and a device isolating region. The device isolating region (e.g., an n-type region) may surround the collector region to support high-side capability by extending laterally under the collector region. The device isolating region may include a well or sinker laterally adjacent the collector region. The collector region may thus be laterally surrounded as well. The device isolating region(s) may be biased at a base potential.

In some embodiments, the device isolating region under the collector region has a non-uniform doping profile. For example, the device isolating region may include alternating or interleaved sections of different dopant concentration levels. The collector region may include one or more portions that extend deeper into the substrate. For example, the collector thickness or depth may thus vary by location. A relatively thicker collector next to the narrow base region may lower the resistance of the collector region and minimize or otherwise decrease the Kirk effect. A deeper pn junction near the narrow section of the base region may improve the collector conduction and further enhance the current gain. Other non-uniformities may be directed to further benefits. For example, allowing the collector region to be deeper and/or thicker below a contact of the collector region may help distribute the base-collector potential more evenly under breakdown conditions, such as at the BVcbo bias condition. An improved potential distribution may result in a higher BVcbo breakdown voltage level.

The base, emitter, and other regions of the self-aligned bipolar transistor devices described herein may be configured via one or more implant procedures directed to fabricating one or more field effect transistor (FET) devices. The disclosed devices may thus be fabricated using a process flow for fabricating FET devices, such as power MOSFET, analog MOSFET, and/or logic MOSFET devices. The implants to form the emitter and the base that utilize different channeling effects to form a diagonal narrow base region self-aligned with the trench edge may be configured to form respective wells of different FET devices (e.g., power and logic FET devices). The implant to form the device isolating region that defies the collector region may be configured to form a buried layer of a power FET device, such as an LDMOS device. Other portions or sections of the emitter, base, and collector regions may be provided via other FET implants, such as source/drain implants, as described below. The fabrication of the disclosed devices may thus avoid adding implants, mask, or other fabrication steps to an existing process flow. Process steps dedicated to the fabrication of the bipolar transistor devices are not added despite the optimization of the steps of the existing process flow for the power, analog, and/or logic FET devices. These advantages are provided despite the customization of the FET-related fabrication process steps. Such customization may otherwise not be conducive to fabricating conventional designs of other, non-FET transistor devices, such as bipolar devices, in the same process flow.

Although described below in connection with a silicon-on-insulator (SOI) substrate, the disclosed devices and fabrication methods are not limited to any particular substrate type or fabrication technology. The semiconductor substrates of the disclosed devices may vary. The configuration, depth, construction, materials and other characteristics of the isolation region with which the emitter-base junction is aligned may also vary. For instance, the disclosed devices and methods are not limited to device arrangements having shallow trench isolation (STI) regions for intra-device isolation or deep trenches for inter-device isolation.

Although described below in connection with pnp bipolar transistor devices, the disclosed devices are not limited to any particular bipolar transistor configuration. N-type base bipolar transistor devices are described and illustrated herein for convenience of description and without any intended limitation. However, npn devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
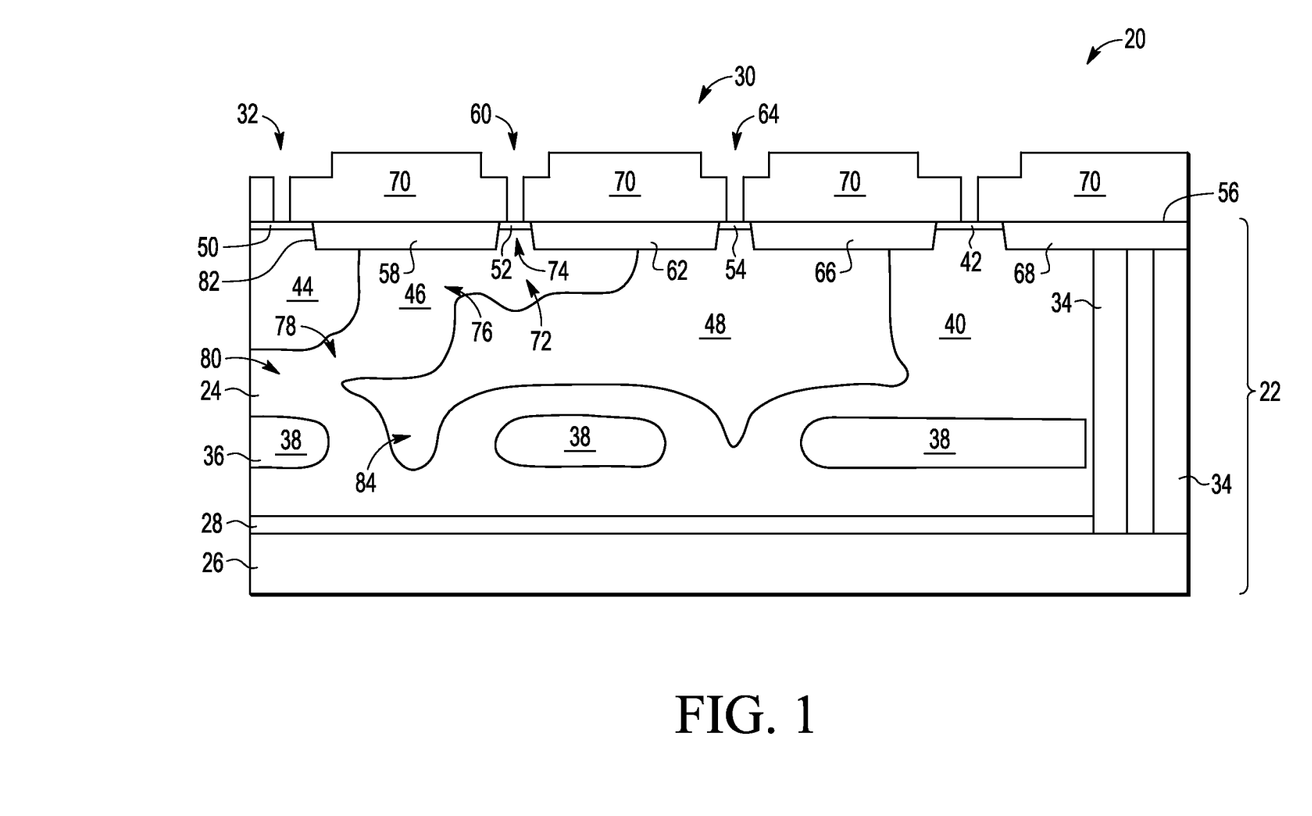
FIG. 1 is a cross-sectional, schematic view of an exemplary bipolar transistor device having a narrowed base region and a diagonally oriented conduction path in accordance with one embodiment.

FIG. 1 is a schematic cross-sectional view of an example of a pnp bipolar transistor device 20 constructed in accordance with one embodiment. The device 20 includes a semiconductor substrate 22, which may, in turn, include a number of epitaxial layers 24. In this example, the semiconductor substrate 22 includes a single p-type epitaxial layer grown on an original substrate 26. The original substrate 26 may include a heavily doped p-type or n-type substrate (e.g., a handle wafer), and may include one or more epitaxial layers. The device 20 may alternatively or additionally include non-epitaxial layers in which one or more device regions are formed. Any one or more of the layers of the semiconductor substrate 22 may include silicon. In this example, the semiconductor substrate 22 has a silicon-on-insulator (SOI) construction. An isolating or insulator layer 28 disposed on the original substrate 26 may include, for example, silicon oxide (e.g., about 0.3 µm). The SOI construction may then include an epitaxial layer (e.g., p-type) on top of the insulator layer 28 having a thickness of, for example, about 1.2-1.5 µm, which may, in turn, act as a seed layer for any further epitaxial growth. The structural, material, and other characteristics of the semiconductor substrate 22 may vary from the example shown. Additional, fewer, or alternative layers may be included in the semiconductor substrate 22. For example, any number of additional semiconductor and/or non-semiconductor layers may be included. The disclosed devices are thus not limited to, for instance, SOI or bulk substrates, or substrates including epitaxially grown layers, and instead may be supported by a wide variety of other types of semiconductor substrates.

A portion of a device active area 30 is depicted in FIG. 1. The device active area 30 may include a portion that mirrors the depicted portion. In this example, the device active area 30 is symmetrical about a central emitter active area 32. In other embodiments, the device 20 is symmetrical about other device active areas or not symmetrical. The device active area 30 may be defined by one or more isolation trenches or regions 34. The isolation trenches or regions 34 may be contiguous with the insulating layer 28 as shown. Alternatively or additionally, the device active area 30 may be defined by one or more doped isolating layers or regions in the semiconductor substrate 22 (e.g., the epitaxial layer 24). The doped isolating layer(s) or region(s) may laterally and/or otherwise surround the device active area 30. These layers or regions act as a barrier or isolation layer separating the device active area 30 from the rest of the substrate 22 (or the original substrate 26). Such barriers or isolation layers may be useful for preventing breakdown during, e.g., high-side operation of the device 20. In this example, an N-type buried layer (NBL) 36 is formed or disposed in the epitaxial layer 24 of the semiconductor substrate 22. The NBL 36 extends laterally across (e.g., under) the device active area 30 of the device 20 to act as a vertical barrier separating the active area 30 from the insulating layer 28 disposed on the original substrate 26. The NBL 36 includes one or more sections 38 of increased dopant concentration relative to portions of the NBL 36 between or adjacent the sections 38. The collector region 48 may extend into space between the sections 38. Further details regarding the NBL 36 are provided below.

The device 20 may include multiple doped isolating regions surrounding the device active area 30 of the device 20. In this example, the device active area 30 is defined laterally by an isolating well or sink 40. The isolating well 40 may be ring-shaped. Alternative or additional device isolating regions may be included to define the lateral extent of the device active area 30. Such regions need not be configured as doped regions, but instead be configured as insulator regions, such as shallow trench isolation (STI) regions. The isolating well 40 may be a moderately or heavily doped n-type region laterally surrounding the device active area 30. The isolating well 40 may be disposed on or otherwise above the NBL 36 and outside of, or along, the lateral periphery of the device active area 30 as shown. The isolating well 40 (or a part thereof) may be formed in conjunction with one or more n-type regions, such as an n-type base region described below. The isolating well 40 may be contiguous with the NBL 36. In this embodiment, the isolating well 40 is deeper under a contact region 42 due to the channeling effect arising from implanting through the active area of the contact region 42 (rather than through an isolation trench). The increased depth may allow the isolating well 40 to connect with the NBL 36. Alternatively, the isolating well 40 may be linked to the NBL 36 via one or more link regions, which may be formed via one or more additional implants. In some embodiments, the NBL 36 and the isolating well 40 may be biased at a voltage via the contact region 42.

One or more of the above-described isolating regions may have a dopant concentration level and/or be otherwise configured for high voltage (HV) operation (e.g., high side operation in which the terminals of the device 20 are level shifted relative to the semiconductor substrate 22, which is typically grounded), including punch-through prevention. Any number of the isolating wells, sinks, or buried layers may be connected to one another. Additional, fewer, or alternative isolation layers or regions may be provided in the semiconductor substrate 22.

The device 20 includes an emitter region 44 in the semiconductor substrate 22, a base region 46 in the semiconductor substrate 22 laterally adjacent the emitter region 44, and a collector region 48 in the semiconductor substrate 22 laterally adjacent the base region 46. Any number of such regions 44, 46, 48 may be provided. In this example, the emitter region 44 includes a p-type well formed in the epitaxial layer 24 of the semiconductor substrate 22. The base region 46 includes an n-type well formed in the epitaxial layer 24 of the semiconductor substrate 22. The collector region 48 includes a region defined by the portion of the epitaxial layer 24 between the base region 46 and the NBL 36 and/or other device isolating regions or sections thereof 38, 40. Alternatively or additionally, the collector region 48 includes one or more regions formed and/or defined by p-type implants rather than solely by the absence or lack of n-type implants, such as in embodiments not having an epitaxial layer. The collector region 48 may have one or more constituent regions or sections formed or configured via such implants, as described below in connection with the embodiment of FIG. 2. The emitter, base, and collector regions 44, 46, 48 may include a respective one or more heavily doped p-type or n-type contact regions or electrodes 50, 52, 54 formed in or otherwise above the respective region 44, 46, 48. The dopant concentration of each contact region 50, 52, 54 may be at a level sufficient to establish a respective ohmic contact.

The contact regions 50, 52, 54 are laterally spaced from one another along a surface 56 of the semiconductor substrate 22. An STI region 58 is disposed between the contact regions 50 and 52. The STI region 58 may define boundaries of the emitter active area 32 and a base active area 60. Another STI region 62 is disposed between the contact regions 52 and 54, thereby defining boundaries of the base active area 60 and a collector active area 64. Further STI regions 66 and 68 are disposed around the contact area 42 and/or may be used to define the lateral boundary of the device active area 30 and/or to isolate or separate other contact regions. For example, another STI region may be used to separate an isolation contact region and a substrate contact region.

The device 20 may include a number of passivation structures 70 supported by the semiconductor substrate 22. Each passivation structure 70 is formed on or otherwise above the surface 56 to isolate adjacent electrodes of the device 20. Each passivation structure 70 may include one or more insulating materials, such as silicon oxide and/or silicon nitride. The materials, configuration, construction, and other characteristics of the passivation structures 70 may vary from the example shown.

The device 20 has a conduction path having an orientation with both lateral and vertical components. A portion of the base region 46 through which the conduction path passes may also be oriented along a gradient with both lateral and vertical components. The base region 46 may include one or more sections having a diagonal orientation. The base region 46 may alternatively or additionally include one or more further non-diagonal sections. The base region 46 in the example of FIG. 1 has a composite construction including a combination of lateral sections, vertical sections, and diagonal sections. The sections of the base region 46 of the example shown in FIG. 1 are described below. The constituent sections of the base region 46 are also described and shown in connection with FIG. 2.

At or near the surface 56 of the semiconductor substrate 22, the base region 46 includes a lateral extension section 72 that extends laterally away from the emitter region 44 to provide a lateral connection to a base connector region 74 between the STI regions 58 and 62 to connect with the base contact region 52. At its inner end, the lateral extension section 72 meets or transitions into a sinker or well section 76 of the base region 46 that increases the depth and thickness of the base region 46 alongside the emitter region 44. At its bottom, the sinker section 76 meets or transitions into a buried conduction path section 78 having a diagonal orientation that establishes the variable depth contour of the emitter-base junction. The buried conduction path section 78 then meets or transitions into a buried lateral section 80 that extends across and under the emitter region 44. The buried conduction path section 78 presents a lateral and vertical shift in the base region 46 between the sinker and buried lateral sections 76 and 80. The buried lateral section 80 may connect with the NBL 36 to define an inner end of the collector region 48.

When viewed in combination, the sections 72, 74, 76, 78, and 80 of the base region 46 present a serpentine or other winding cross-sectional shape to allow the base region 46 to support a buried, diagonal conduction path, despite the laterally spaced contacts for the device at the surface 56. The shape of the base region 46 may also lead to the narrowed nature of the buried conduction path section 78. The width of the base region 46 may vary between the sections thereof. In this example, the effective width of the base region 46 for the charge carriers (e.g., a dimension transverse to the emitter-base junction) is narrower in the buried conduction path section 78 than in each of the other sections of the base region 46. For instance, the lateral extension section 72 and/or other sections of the base region 46 disposed at or along the surface of the semiconductor substrate are wider than the buried conduction path section 78. The serpentine or other winding shape of the base region may also lead to a lateral distribution that overlaps the emitter and collector regions.

The width of the base region 46 may be non-uniform. For example, the sinker section 76 may be wider than the buried conduction path section 78. In the embodiment of FIG. 1, the sinker section 76 extends laterally outward into the collector region 48 due to the low doping concentration of the epitaxial layer 24 that forms the collector region 48.

The shape of the base region 46 may dispose one or more sections of the base region 46 above a portion the collector region 48. For example, the lateral extension region 72 is configured to support a lateral position of the base contact region 52 above a portion of the collector region 48. Base width modulation may be minimized or decreased as a result of positioning the base contact region 52 above the collector region 48. With the base region 46 pushed laterally outward into the collector region 48, the device 20 may have an improved (e.g., higher) Early voltage.

One or more of the constituent sections of the base region 46 may define the emitter-base junction. In the example of FIG. 1, the sinker section 76, the buried conduction path section 78, and the buried lateral section 80 are disposed along the emitter-base junction. The sinker section 76 is disposed laterally alongside the emitter region 44 to define a vertically oriented portion of the emitter-base junction. The buried lateral section 80 is disposed under the emitter region 44 to define a laterally oriented portion of the emitter-base junction. The buried conduction path section 78 defines an intermediate portion of the emitter-base junction in between the above-referenced portions through which the charge carriers pass. The intermediate portion of the emitter-base junction has a variable depth contour that corresponds with the contour of the buried conduction path section 78 of the base region 46. As described below, the manner in which the variable depth contour of the buried conduction path section 78 is formed results in a narrowing of the base region 46 to support a shorter conduction path. The buried conduction path section 78 may be referred to as a narrowed section of the base region 46. The shift narrows the base region 46 to decrease the length of the conduction path between the emitter and collector regions. In the pnp example of FIG. 1, the majority of holes are injected from the emitter region 44 into the narrowed section of the base region 46 for collection by the collector region 48.

The buried conduction path section 78 of the base region 46 is configured and/or oriented such that the conduction path has an orientation with a non-lateral or vertical component. The depth of the charge carriers increases as the charge carriers pass through the base region 46 to reach the collector region 48. In the example shown in FIG. 1, the buried conduction path section 78 is oriented along a first diagonal direction and the conduction path is oriented along a second diagonal direction transverse to the first diagonal direction.

The manner in which the base region 46 is divided into sections may vary from the foregoing description. For instance, the lateral extension section 72 may not be considered to reach the emitter region 44, in which case the sinker or well region 76 may be considered to extend downward from the STI region 58 rather than from the lateral extension section 72. The composite shape of the base region 46 may also vary from the example shown. For instance, the base region 46 need not include each of the above-described sections, or have a serpentine-like shape.

The buried conduction path section 78 may be disposed at a depth sufficient to avoid complications that may otherwise arise from surface charge effects. The orientation of the conduction path then increases the depth of the charge carriers passing through the emitter-base junction. The conduction path is oriented in a diagonal direction of increasing depth as the charge carriers pass through the base region 46 to reach the collector region 48. The vertical component of the conduction path thus increases the depth of the charge carriers. The conduction path in the base region 46 may thus be sufficiently buried throughout the lateral extent of the base region 46, thereby avoiding the surface charge effects presented by purely lateral bipolar transistor devices.

The buried conduction path section 78 of the base region 46 is aligned with an edge or sidewall 82 of the STI region 58. The lateral position of the buried conduction path section 78 is based upon the lateral position of the edge 82. In this example, the variable depth contour of the buried conduction path section 78 begins at the lateral position of the edge 82. The base region 46 and the emitter-base junction begin to slope or curve upward at the lateral position of the edge 82 due to the different implant channeling effects described below.

The base region 46 and one or more of the constituent sections thereof are self-aligned as a result of the channeling effects. For example, the lateral position of the buried conduction path section 78 is not dependent upon the alignment of the implants used to create the emitter and base regions 44 and 46. The implants, which are described below, may be offset from an intended position or otherwise misaligned without affecting the location of the conduction path and/or the location at which the conduction path crosses the emitter-base junction. The lateral position of the buried conduction path section 78 of the base region 44 and the emitter-base junction alongside the section are instead defined by the edge 82 of the STI region 58. The position of the conduction path may thus be established.

The collector region 48 may include one or more features configured in accordance with the position of the conduction path and the base region 46. The collector region 48 may be defined between the base region 46 and the NBL 36. The collector region 48 may be disposed laterally between the base region 46 and the well 40, and vertically disposed between the base region 46 and the NBL 36. The continuous nature of the NBL 36 may enclose the collector region 48 to achieve high-side capability. The NBL 36 may be biased with the base potential via the above-described link at the section 80 and/or via a metal or other conductive connection. In the embodiment of FIG. 1, the NBL 36 is non-uniform, with heavily doped and lightly doped regions interleaved with each other. As a result, the collector thickness varies as a function of lateral position. A relatively thicker section of the collector region 48 adjacent and/or below the narrow section of the base region 46 may lower the collector resistance and decrease or minimize the Kirk effect. The non-uniformity of the NBL 36 may also increase the depth and/or thickness of the collector region 48 under the collector contact region 54. As a result, the equipotential lines between the base and collector regions, and/or between the emitter and collector regions, may be spread farther apart, resulting in improved breakdown voltage levels, such as BVcbo and BVceo.

In the example of FIG. 1, the collector region 48 includes a buried section 84 adjacent the buried conduction path section 78 of the base region 46. The buried section 84 may be deeper than one or more sections or portions of the collector region 48, such as the buried conduction path section 78. The buried section 84 may also be shallower than one or more sections or portions of the collector region 48, such as the section under the contact region 54. The buried section 84 may extend into a notch or other space between the sections 38 of the NBL 36, which may thus extend across the lateral extent of the collector region 48. The depth of the buried section 84 may thus be greater than the depth of one or more sections of the collector region 48 (with one or more possible exceptions, as noted above). The presence of a thicker section of the collector region 48 near the narrowed section of the base region 46 may improve the current gain of the device 20.

The NBL 36 may have a dopant concentration level that varies laterally to create the buried section 84 and the notch or space into which the section 84 extends. The varying dopant concentration level allows the collector region 48 to extend deeper into the semiconductor substrate 22 in one or more portions of the collector region under the base region 46.

The NBL 36 extends across the lateral extent of the collector region 48, and thus the device active area, despite the varying dopant concentration level. The lateral extent of the NBL 36 may thus allow the base region 46 and the NBL 36 to be connected or otherwise electrically tied to one another. The base region 46 and the NBL may thus be biased at a common voltage.

The device 20 is shown in simplified form and, thus, FIG. 1 does not show the conductive (e.g., ohmic) contacts and other metal layers configured for electric coupling with the emitter, base, and collector regions 44, 46, and 48 and other device structures. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be disposed between the original substrate 26 and the active area 30. One or more further STI regions, other isolation trenches, and/or isolation wells (not shown) may be provided to isolate the active area 30 and/or other region of the device 20.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
|---|---|---|
| p-epi 24: | $2 \times 10^{15}/cm^3$ | 5 µm |
| substrate 26: | $2 \times 10^{15}/cm^3$ | not applicable |
| NBL 36 | $5 \times 10^{17}/cm^3$- $9 \times 10^{18}/cm^3$ | 1.5 µm |
| well 40: | $3 \times 10^{16}/cm^3$ | 4.0 µm |
| emitter 44: | $8 \times 10^{17}/cm^3$ | 2.5 µm |
| base 46: | $3 \times 10^{16}/cm^3$ | 0.5-4.0 µm |
| collector 48: | $2 \times 10^{15}/cm^3$ | 0.2-4.5 µm |
| contact 50 | $2 \times 10^{21}/cm^3$ | 0.2 µm |
| contact 52 | $2 \times 10^{21}/cm^3$ | 0.2 µm |
| contact 54 | $2 \times 10^{21}/cm^3$ | 0.2 µm |

The concentrations and thicknesses may be different in other embodiments. For example, the dopant concentration of the original substrate 26 may vary considerably.

Figure 2:
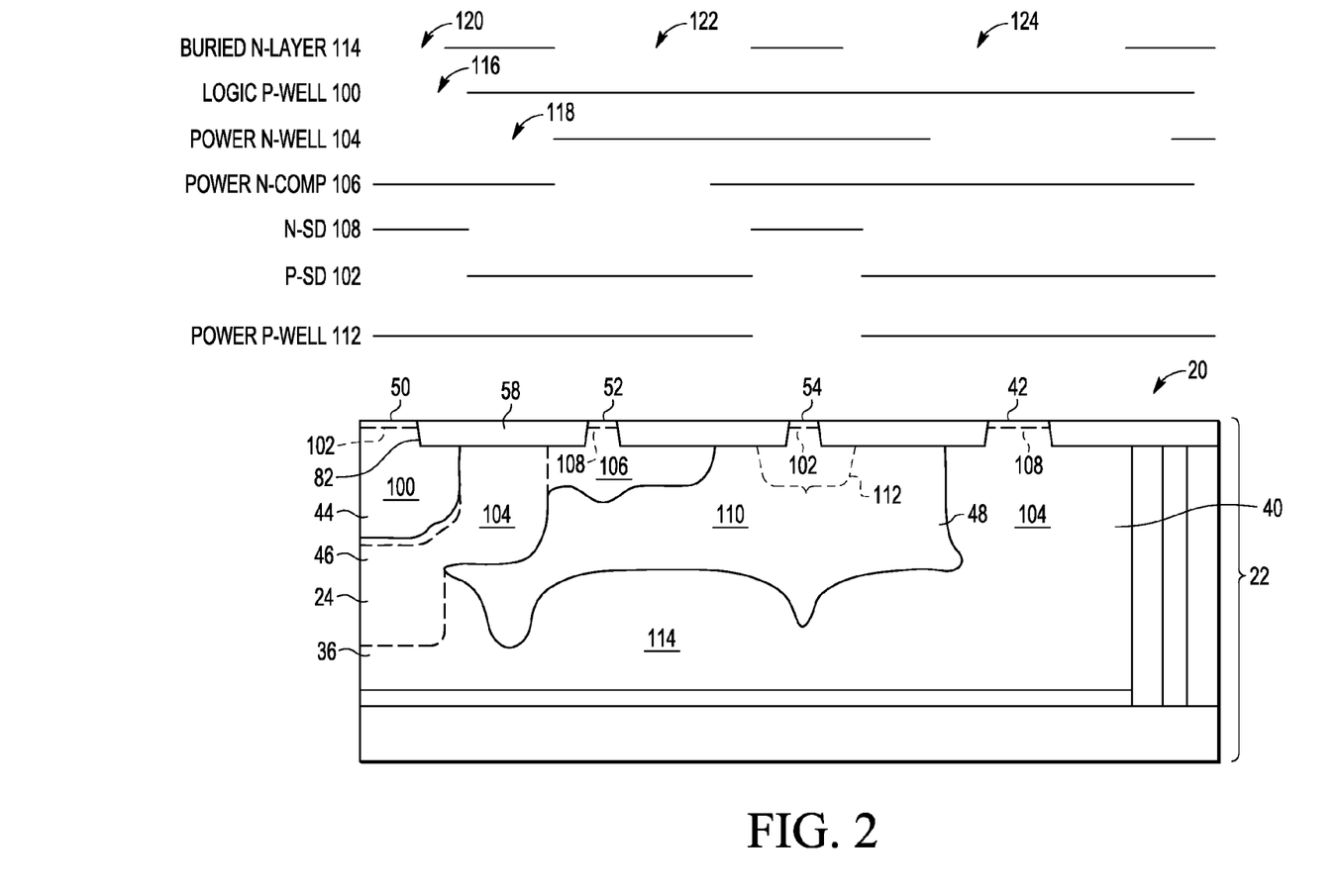
FIG. 2 is a cross-sectional, schematic view of dopant implantation regions of the bipolar transistor device of FIG. 1, along with a schematic view of exemplary dopant implantation masks used to create the dopant implantation regions.

FIG. 2 schematically depicts the device 20 in connection with a set of dopant implantation masks used to form the emitter, base, and collector regions 44, 46, 48 (or a section thereof). Each mask is depicted as a line having one or more openings through which the dopant ions can pass to reach the semiconductor substrate 22. In this embodiment, each of the dopant implantation masks corresponds with an existing dopant implantation procedure associated with the fabrication of one or more FET device designs. For example, the existing implantation procedures may be directed to fabricating a high voltage or power FET device (e.g., an LDMOS device), an analog FET device, or a low voltage or logic FET device. The dopant concentration, ion energy, implant angle, and/or other characteristics of the implants may thus vary in accordance with the parameters established by the FET device design(s). In other embodiments, one or more implantation masks may be used that do not correspond with an existing mask or implant. The disclosed devices are thus not limited to designs in which each feature is fabricated via an implant used to fabricate a FET device. The disclosed devices are also not limited to designs in which the dopant for each region (or section thereof) is provided via an implantation procedure. In this example, a primary portion or main body of the collector region 48 is doped during the growth of the p-type epitaxial layer 24. Fewer, additional, or alternative regions (or sections thereof) may be formed in this manner.

Each of the emitter, base, and collector regions 44, 46, 48 may be formed via a respective combination of multiple implants. The combination may be configured to establish a contact section and a primary section or main body of the respective region. For example, the main body of the emitter region 44 is formed via a p-type low voltage or logic FET well implant 100, and the emitter contact region 50 is formed via a p-type source/drain implant 102. The dopant distributions resulting from the implants 100, 102 overlap to form the emitter region 44. The approximate boundaries of the dopant distributions resulting from the implants 100, 102 are indicated with dashed lines.

Some implant combinations may be configured to establish respective portions or sections of a composite body. Irregularly shaped and/or variably doped regions may thus be formed. For example, the serpentine-shaped configuration of the base region 46 is formed via an n-type high voltage or power FET well implant 104 and an n-type power FET epi- compensation implant 106. The base contact region 52 may be formed by an n-type source/drain implant 108.

The collector region 48 in this example is formed via a combination of a remaining section 110 of the epitaxial layer 24 and two FET implants, the p-type source/drain implant 102 and a p-type power FET well implant 112. The p-type power FET well implant 112 may thus raise the dopant concentration level of a portion of the collector region 48 from the exemplary level noted above. The remaining section 110 of the epitaxial layer 24 is defined via a buried n-type layer implant 114 directed to forming the NBL 36.

The same implant may be used to form multiple regions or region sections. For example, the n-type source/drain implant 108 may also be used to form the contact region 42 for the device isolating region 40, which may be formed by the n-type power FET well implant 104. To these ends, the masks for the implants 104, 108 may be configured with additional openings as shown.

The implants 100 and 104 use masks having respective openings 116 and 118 that span the edge 82 of the STI region 58. Due to different channeling effects in the active region and under the STI region 58, the dopant distributions resulting from the implants 100 and 104 are deeper in the active region than those underneath the trench. The shift in depth establishes the above-described contoured doping profile, which in turn forms the narrow section of the base region 46 and diagonal or graded orientation of the emitter-base junction. The narrowing of the base region 46 is thus self-aligned with the trench edge 82 adjacent to the emitter region 44, and is not affected by misalignment of the implants 100 and 104. The mask openings 116, 118 in this example overlap in an area under the STI region 58 to define the graded section of the emitter-base junction.

The n-type compensation implant 106 may be configured to dope the lateral extension section 72 (FIG. 1) at low to moderate dopant concentration levels. The n-type compensation implant 106 may thus compensate for the p-type doping of the epitaxial layer 24 without reaching heavy n-type dopant concentration levels. In one example, the n-type compensation implant 106 is configured to support a dopant concentration level of $5\times10^{15}/cm^3$-$1\times10^{17}/cm^3$. The n-type compensation implant 106 may also have an energy level configured for a shallow depth (e.g., shallower than the depth of the emitter region 44). The shallow depth and the dopant concentration level may be configured for an accumulation and/or drift region of an LDMOS device. For the pnp bipolar device 20, the n-type compensation implant 106 may establish a base connector for the base region 46, while improving the Early voltage in cases where the base contact 52 is broadly enclosed by the n-type compensation implant 106 so that the lateral width of the base region 46 is not significantly modulated by the collector voltage.

The buried n-type layer implant 114 may use a mask having openings 120, 122, and 124 to establish the above-described non-uniformities while achieving high-side capability. Each opening 120, 122, 124 may form a respective island or ring (see the sections 38 in FIG. 1). The collector region 48 is nonetheless surrounded by the NBL 36 because the dopant in the islands or rings diffuses or spreads laterally during subsequent thermal cycles in the fabrication process. A continuous buried layer with non-uniform dopant concentration along the lateral direction may thus be formed. The regions that receive the implant 114 have a higher dopant concentration than those that do not receive the implant 114 directly.

The dopant ion energy levels for the above-described implants may vary. In one example of the embodiment shown in FIG. 2, the above-referenced implants may have the following approximate ion implant energies:

|  | Ion | Ion Energy | Angle |
|---|---|---|---|
| logic p-well 100: | B | 550 KeV | 0° |
| p-source/drain 102: | B | 5 KeV | 0° |
| power n-well 104: | P | 2000 KeV | 1° |
| power n-comp 106: | P | 720 KeV | 1° |
| n-source/drain 108: | As | 30 KeV | 0° |
| power p-well 112: | B | 350 KeV | 4° |
| buried n-layer 114: | Sb | 75 KeV | 0° |

Figure 3:
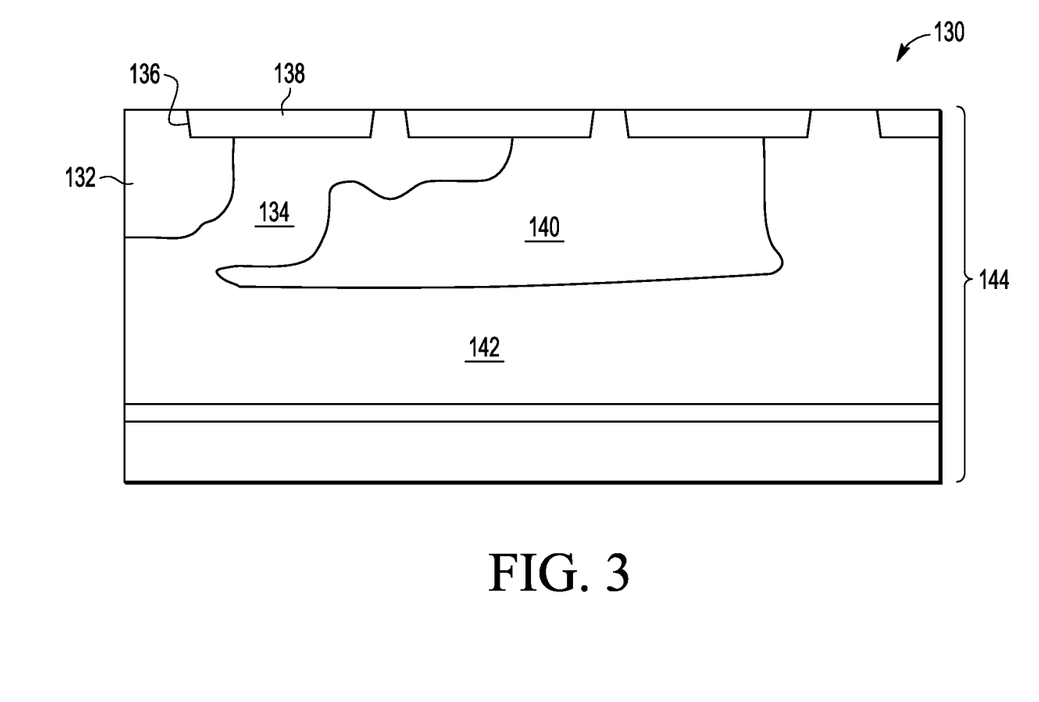
FIG. 3 is a cross-sectional, schematic view of another exemplary bipolar transistor device having a narrowed base region and a diagonally oriented conduction path in accordance with one embodiment.

FIG. 3 shows another exemplary bipolar transistor device 130 fabricated and configured in accordance with one or more aspects of the disclosure. The device 130 has an emitter region 132 and a base region 134 configured in a manner similar to the embodiments described above. For instance, the base region 134 and the emitter-base junction have a variable depth contour aligned with an edge 136 of a trench isolation region 138 (e.g., an STI region). The base region 134 accordingly narrows or necks down as a result of the shift in depth as described above.

The device 130 differs from the above-described embodiments in the configuration of a collector region 140. In this example, an n-type buried layer (NBL) 142 continuously and uniformly extends laterally across the collector region 140. The NBL 142 may thus have a uniform dopant concentration level laterally across the collector region 140. The collector region 140 may have a correspondingly more uniform lower boundary due to the absence of the extensions into the NBL described above. The lack of such extensions into the NBL 142 increases the effective spacing of the collector region 140 from the remainder of a semiconductor substrate 144.

Figure 4:
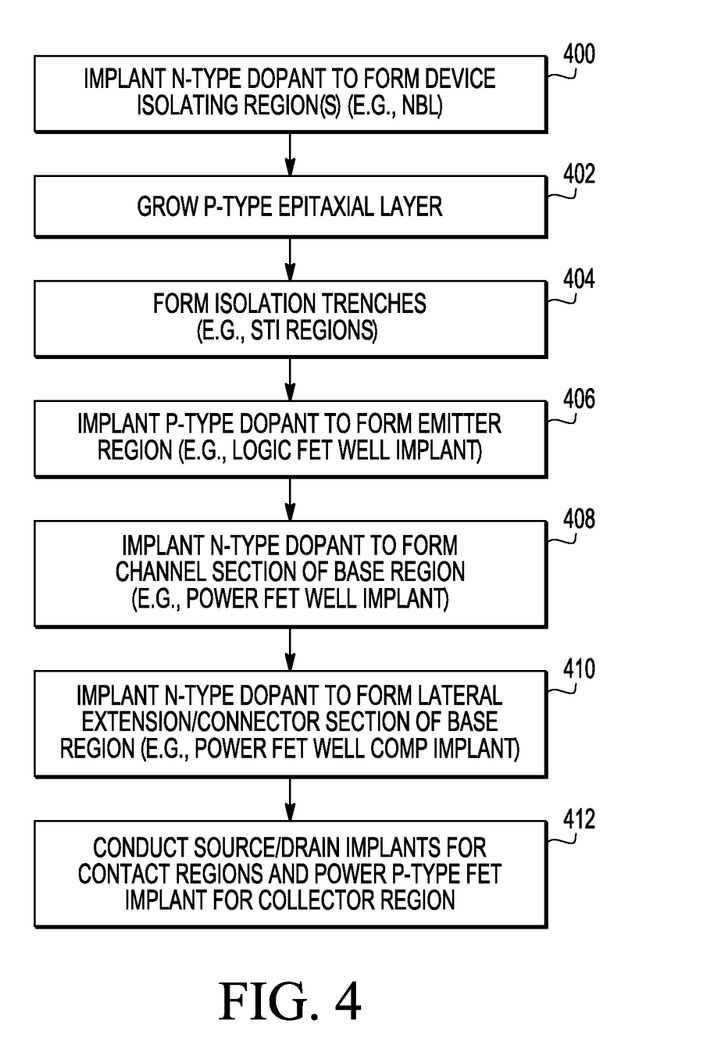
FIG. 4 is a flow diagram of an exemplary fabrication sequence to construct a bipolar transistor device having a narrowed base region and a diagonally oriented conduction path in accordance with one embodiment.

FIG. 4 shows an exemplary fabrication method for fabricating a bipolar transistor device with a narrowed base region and a diagonally oriented conduction path as described above. The transistor device is fabricated with a semiconductor substrate, the regions or layers of which may have the conductivity types of the pnp transistor examples described above, or be alternatively configured to support an npn transistor device. The method includes a sequence of acts or steps, only the salient of which are depicted for convenience in illustration. The ordering of the acts may vary in other embodiments. For example, the implant in a step 406 may be performed after the implant in a step 408.

The method may begin with, or include, a step 400 in which one or more other doped device isolating regions are formed in a semiconductor substrate to define the vertical and lateral boundaries of a collector region of the device. The semiconductor substrate may be an SOI substrate. In one example, the semiconductor substrate includes a 0.3 μm buried oxide (BOX) layer disposed on a lightly doped n-type handler wafer, and p-type epitaxial layer (e.g., about 1.5 μm) disposed on the BOX layer. The semiconductor substrate may include a p-type handler or other original semiconductor substrate on which the insulator, epitaxial, or other layers are grown or otherwise formed. In one embodiment, an implant is performed to form an NBL layer in the p-type epitaxial layer of the semiconductor substrate. Any number of epitaxial layers may be present or grown. The device isolating region(s) may be formed by one or more implant procedures. The implant procedure(s) may use a mask configured to form islands or rings as described above. A continuous but non-uniform buried layer may then be formed due to diffusion or spreading after the implant procedure. In other embodiments (e.g., those having a uniform buried layer), the buried layer may be formed during the growth of an epitaxial layer.

In a step 402, a p-type epitaxial layer is grown on the semiconductor substrate. The p-type epitaxial layer may have a thickness of about 3.5 μm. The above-described p-type epitaxial layer may act as a seed layer for such further epitaxial growth. The epitaxial layer defines a surface of the semiconductor substrate. In one example, the p-type epitaxial layer has a thickness of about 4 μm.

The steps 400 and/or 402 may also include one or more procedures to define a lateral periphery of the device. Such procedures may include forming one or more deep isolation trenches as shown in FIG. 1. In one embodiment, the center of the deep isolation trenches may be filled with highly doped (e.g., n-type) polysilicon, which may then be surrounded by one or more dielectric layers. The width of the deep isolation trenches may be about 1.5 μm. Alternatively, such trenches may be formed via, for example, an implantation procedure that damages or otherwise changes the structure of the epitaxial layer(s). In some cases, the deep isolation trenches may be formed or defined after the formation of shallow trench isolation (STI) regions, although the order in which the trenches are formed may differ.

In a step 404, STI regions or other isolation trenches may then be formed at a surface of the semiconductor substrate. The STI regions may be formed via any now known or hereafter developed procedure. For example, the step 404 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the accumulation/drift region is formed.

One of the STI regions is disposed to create an edge used for positioning a variable depth contour of a base region and thus the emitter-base junction. The edge defines a boundary of an emitter active area. The STI region is disposed between active areas of the device in which contact regions for the base and emitter regions are formed. Other STI regions disposed between other pairs of contact regions may provide further isolation at the surface of the semiconductor substrate.

In a step 406, p-type dopant is implanted through a mask opening configured to form the emitter region in the semiconductor substrate. In a step 408, n-type dopant is implanted through another mask opening to form a conduction path section of the base region in the semiconductor substrate adjacent the emitter region.

Both of the mask openings for the steps 406, 408 span the edge of the isolation region such that a junction between the emitter and base regions has a variable depth contour based on an extent to which the dopant of the first conductivity type and the dopant of the second conductivity type pass through the STI region. The mask openings may overlap in an area under the isolation region to define a graded section of the emitter-base junction. Because the mask openings span the edge of the isolation region, an extent to which the dopant passes through the STI region varies laterally to establish the variable depth contour or boundary of the base region (or of the emitter-base junction). The variable depth contour may then establish a diagonal conduction path through the base region.

The mask opening for the step 408 may be configured to also form an n-type device isolating well along a lateral periphery of the device. The n-type well may meet the NBL or other doped isolating region formed in the step 402.

In some embodiments, the implant procedures implemented in the steps 406 and 408 correspond with implants performed and configured to fabricate regions of FET devices. For example, the p-type implant may be a logic field-effect transistor (FET) well implant procedure. The n-type implant may be a power field-effect transistor (FET) well implant procedure.

The collector region of the device may be formed in the remaining portions of the epitaxial layer undoped by the above-described n-type implants steps. Thus, the p-type implant for the emitter region is not used to form the collector region. As described above and shown in FIG. 1, the collector region may extend deeper into the NBL or other device isolating region in a first portion of the collector region under the base region than in a second portion of the collector region not under the base region.

The base region may include one or more further sections formed via respective implants. In this example, further n-type dopant is implanted in a step 410 to form a lateral extension section of the base region. The section may be configured as a base connector that links the conduction path section with a base contact region at the surface. The implant of the step 410 may correspond with a FET device implant, such as an n-type compensation implant performed during fabrication of a power FET device.

In a step 412, contact regions of the emitter, base, and collector regions are formed via respective implants. The implants may correspond with source/drain implants for a FET device, such as a logic FET device. The step 412 may include one or more additional FET device implants, such as a p-type power FET implant, which may be used to increase the doping of the collector region in a section adjacent the collector contact, as described above.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed. The procedures may be implemented in various orders. Additional or alternative procedures may be implemented.

The disclosed devices include a high gain bipolar transistor with high Early voltage and high breakdown voltages. The disclosed devices may be fabricated on an SOI substrate. The disclosed devices include a self-aligned base region formed due to different channeling effects for the emitter and base implants in active and field areas. To achieve high-side capability, the disclosed devices may include a collector region enclosed by a continuous n-type region biased with the base potential. The non-uniformity of the n-type region underneath the collector region causes the collector thickness to vary at different lateral locations. A thicker section of the collector region near the narrow base region may improve the current gain.

The disclosed devices may be fabricated cost effectively during a process flow configured for one or more FET device designs. The disclosed devices may be fabricated without additional masks or procedures.

In a first aspect, a method of fabricating a bipolar transistor including emitter and base regions having first and second conductivity types, respectively, includes forming an isolation region at a surface of a semiconductor substrate. The isolation region has an edge that defines a boundary of an active area of the emitter region. The method further includes implanting dopant of the second conductivity type through a mask opening to form the base region in the semiconductor substrate. The mask opening spans the edge of the isolation region such that an extent to which the dopant passes through the isolation region varies laterally to establish a variable depth contour of the base region.

In a second aspect, a method of fabricating a bipolar transistor includes forming an isolation region at a surface of a semiconductor substrate, implanting dopant of a first conductivity type through a first mask opening to form an emitter region in the semiconductor substrate, and implanting dopant of a second conductivity type through a second mask opening to form a base region in the semiconductor substrate adjacent the emitter region. The first and second mask openings span an edge of the isolation region such that a junction between the emitter and base regions has a variable depth contour based on an extent to which the dopant of the first conductivity type and the dopant of the second conductivity type pass through the isolation region.

In a third aspect, a device includes a semiconductor substrate, an emitter region in the semiconductor substrate and having a first conductivity type, a base region in the semiconductor substrate laterally adjacent the emitter region and having a second conductivity type, and a collector region in the semiconductor substrate laterally adjacent the base region and having the first conductivity type. A junction between the base region and the emitter region has a variable depth contour that defines a narrowed section of the base region to support a conduction path across the narrowed section between the emitter and collector regions.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a bipolar transistor comprising emitter and base regions having first and second conductivity types, respectively, the method comprising:
   forming an isolation region at a surface of a semiconductor substrate, the isolation region having an edge that defines a boundary of an active area of the emitter region; and
   implanting dopant of the second conductivity type through respective portions of the isolation region and the active area defined by a mask opening to form the base region in the semiconductor substrate, the mask opening spanning the edge of the isolation region such that the dopant passing through the isolation region forms a first section of the base region with a shallower lower boundary than a second section of the base region formed by the dopant not passing through the isolation region to establish a variable depth contour of the base region;
   wherein the shallower lower boundary of the first section of the base region defines a base-collector boundary.

2. The method of claim 1, further comprising implanting dopant of the first conductivity type through a further mask opening spanning the edge of the isolation region to form the emitter region in the semiconductor substrate such that an extent to which the dopant of the first conductivity type passes through the isolation region varies to establish a diagonally oriented junction between the base and emitter regions.

3. The method of claim 2, wherein implanting the dopant of the first conductivity type does not form a collector region of the bipolar transistor.

4. The method of claim 2, wherein the mask openings to form the base and emitter regions overlap in an area under the isolation region to define a graded section of a junction between the base and emitter regions.

5. The method of claim 1, further comprising growing an epitaxial layer having the first conductivity type to define the surface of the semiconductor substrate.

6. The method of claim 5, further comprising implanting further dopant of the second conductivity type to form a device isolating region around a collector region of the bipolar transistor, the collector region being disposed in a portion of the epitaxial layer undoped by dopant implants of the second conductivity type.

7. The method of claim 6, wherein implanting the further dopant is implemented using a mask configured such that the device isolating region has a dopant concentration level that varies laterally across the collector region.

8. The method of claim 6, wherein implanting the further dopant is implemented using a mask configured such that the device isolating region has a uniform dopant concentration level laterally across the collector region.

9. The method of claim 1, wherein implanting the dopant of second conductivity type comprises performing a first power field-effect transistor (FET) well implant procedure configured to form a first portion of the base region, the method further comprising performing a second power FET well implant procedure to implant further dopant of the second conductivity type to form a second portion of the base region shallower than the first portion.

10. The method of claim 1, wherein:
the first section of the base region is a well section disposed alongside the emitter region; and
the second section of the base region is a buried lateral section that extends across and under the emitter region.

11. The method of claim 10, wherein the dopant forms a buried conduction path section of the base region through which charge carriers from the emitter region pass during operation, the buried conduction path section transitioning into the well section and the buried lateral section.

12. The method of claim 11, wherein the buried conduction path section has a diagonal orientation.

13. The method of claim 11, wherein a conduction path for the charge carriers through the buried conduction path section is shorter than other paths between the emitter region and a collector region that pass through either the well section or the buried lateral section.

14. The method of claim 11, wherein the buried conduction path section defines a diagonal orientation of a portion of an emitter-base junction.

15. The method of claim 14, wherein the well section and the buried lateral section define vertically and laterally oriented portions of the emitter-base junction.

16. A method of fabricating a bipolar transistor, the method comprising:
forming an isolation region at a surface of a semiconductor substrate, the isolation region having an edge that defines a boundary of an active area of an emitter region;
implanting dopant of a first conductivity type through respective portions of the isolation region and the active area defined by a first mask opening to form the emitter region in the semiconductor substrate; and
implanting dopant of a second conductivity type through respective portions of the isolation region and the active area defined by a second mask opening to form a base region in the semiconductor substrate adjacent the emitter region;
wherein the first and second mask openings span the edge of the isolation region such that a junction between the emitter and base regions has a variable depth contour based on the dopant of the first conductivity type and the dopant of the second conductivity type passing through the isolation region and such that the dopant passing through the isolation region forms a first section of the base region with a shallower lower boundary than a second section of the base region formed by the dopant not passing through the isolation region to establish a variable depth contour of the base region;
wherein the shallower lower boundary of the first section of the base region defines a base-collector boundary.

17. The method of claim 16, wherein implanting the dopant of the first conductivity type comprises performing a logic field-effect transistor (FET) well implant procedure.

18. The method of claim 16, wherein implanting the dopant of the second conductivity type comprises performing a power field-effect transistor (FET) well implant procedure.

19. The method of claim 16, further comprising:
growing an epitaxial layer having the first conductivity type to define the surface of the semiconductor substrate; and
implanting further dopant of the second conductivity type to form a device isolating region around a collector region of the bipolar transistor, the collector region being disposed in a portion of the epitaxial layer undoped by dopant implants of the second conductivity type;
wherein the collector region extends deeper into the device isolating region in a first portion of the collector region under the base region than in a second portion of the collector region not under the base region.

20. The method of claim 16, wherein:
the dopant of the second conductivity type forms a buried conduction path section of the base region through which charge carriers from the emitter region pass during operation; and
the buried conduction path section has a diagonal orientation.

* * * * *